United States Patent [19]

Tanaka et al.

[11] Patent Number: 5,253,206
[45] Date of Patent: Oct. 12, 1993

[54] ELECTRICALLY ERASABLE PROGRAMMABLE READ-ONLY MEMORY WITH THRESHOLD VALUE MEASUREMENT CIRCUIT

[75] Inventors: Yoshiyuki Tanaka, Tokyo; Masaki Momodomi; Fujio Masuoka, both of Yokohama, all of Japan

[73] Assignee: Kabushiki Kaisha Toshiba, Kawasaki, Japan

[21] Appl. No.: 676,568

[22] Filed: Mar. 28, 1991

[30] Foreign Application Priority Data

Mar. 30, 1990 [JP] Japan .................................... 2-84636

[51] Int. Cl.⁵ .............................................. G11C 11/40
[52] U.S. Cl. ................................ 365/189.09; 365/185
[58] Field of Search ................... 365/185, 189.09, 201, 365/218; 257/314, 315

[56] References Cited

U.S. PATENT DOCUMENTS

| | | | |
|---|---|---|---|
| 4,799,195 | 1/1989 | Iwahashi et al. | 365/185 |
| 4,903,236 | 2/1990 | Nakayama et al. | 365/218 X |
| 4,939,690 | 7/1990 | Momodomi et al. | 365/185 |
| 4,959,812 | 9/1990 | Momodomi et al. | 365/185 |
| 4,996,669 | 2/1991 | Endoh et al. | 365/185 |

OTHER PUBLICATIONS

Imondi et al, A 5V-Only 256k Bit CMOS Flash EEPROM, ISSCC, Feb. 16, 1989, pp. 132-133.
Momodomi et al, A High Density NAND EEPROM with Block-Page Programming for Microcomputer Applications, IEE 1989 Custom Integrated Circuits Conference, pp. 10.1.1-10.1.4, May 15-18, 1989.

*Primary Examiner*—Robert J. Pascal
*Assistant Examiner*—Seung Ham
*Attorney, Agent, or Firm*—Oblon, Spivak, McClelland, Maier & Neustadt

[57] ABSTRACT

A NAND cell type electrically erasable programmable read-only memory has NAND cell units. Each NAND cell unit has a series array of floating gate type metaloxide semiconductor field effect transistors as memory cell transistors. The first-stage memory cell transistor is connected at its gate to a corresponding bit line via a first select transistor The last-stage memory cell transistor is connected at its source to a common source line by means of a second select transistor. The common source line is connected with a test circuit to be used for measuring the distribution of threshold values of the memory cell transistors in the erasing state. The test circuit temporarily applies the common source line with a positive bias voltage of a predetermined potential level so that the potential of the control gate of a selected memory cell transistor is set at to 0 volt. As a result, the threshold value of the EEPROM in the erasing state can be measured without using any negative potential.

12 Claims, 7 Drawing Sheets

ELECTRICALLY ERASABLE PROGRAMMABLE READ-ONLY MEMORY WITH THRESHOLD VALUE MEASUREMENT CIRCUIT

BACKGROUND OF THE INVENTION

1. Field of the Invention

This invention relates to nonvolatile semiconductor memories, and more particularly to electrically erasable programmable read-only memory devices of large capacity.

2. Description of the Related Art

With the increasing needs for high performance and high reliability of digital computer systems, it is strongly required to develop a rewritable semiconductor memory having a memory capacity which is so large that the memory can be used instead of an existing external data storing medium such as a magnetic disk or a fixed disk unit (which is sometimes called a "hard disk device") used for a computer.

Recently, in order to meet the above requirement, an electrically erasable programmable nonvolatile read-only memory (hereinafter referred to as an "EEPROM" according to the custom of this technical field) in which the memory integration density is enhanced by reducing the number of transistors used in each memory section on a chip substrate with limited size has been proposed and developed.

This type of EEPROM is typically called a "NAND type EEPROM" in which series circuits of floating gate type metal oxide semiconductor field effect transistors (referred to as "MOSFETs" hereinafter) are connected to a corresponding bit line via a switching transistor. The switching transistor is rendered conductive when designated to selectively connect the series array of floating gate type MOSFETs to a corresponding bit line associated therewith, and is generally called a "select transistor."

Each of the serially arrayed floating gate type MOSFETs is a minimum element for storing data and may be considered to correspond to a memory cell of a conventional dynamic random access memories, that is, DRAMs (of course, the series array of MOSFETs itself is sometimes called a "memory cell." The naming is not particularly important. For example, in this patent specification, each series array of MOSFETs will be named as a "NAND cell unit"). In general, each transistor array consists of 4, 8 or 16 floating gate type MOSFETs. Each MOSFET has a control gate connected to a corresponding word line and a floating gate for storing charges representing logic data of "1" or "0." Since each memory cell can be formed of one floating gate type MOSFET, the integration density of the EEPROM can be enhanced and therefore the memory capacity thereof can be increased.

In the above NAND type EEPROM, data is sequentially written into the floating gate type MOSFETs, that is, memory cell transistors in each NAND cell unit. In a case where logic data is written into the EEPROM at a desired memory address, that is, into a selected one of the floating gate type MOSFETs of the designated NAND cell unit, a high voltage Vpp of 20 volts, for example, and an intermediate voltage Vppm—it has a potential level between the power source voltage Vcc of the EEPROM and the high voltage Vpp and is typically set at 10 volts when the power source voltage Vcc is 5 volts—are used as follows. The high voltage Vpp is applied to the control gate electrode of a selected memory cell transistor, and the intermediate voltage Vppm is applied to the control gate electrodes of non-selected memory cell transistors lying between the selected memory cell transistor and the select transistor. The non-selected memory cell transistors are rendered conductive.

When, under this condition, a voltage of 0 volt is applied to a corresponding bit line as a data voltage representing a logic data value, the data voltage is transmitted to a target memory cell, that is, to the drain of the selected floating gate type MOSFET via the non-selected memory cell transistors which are rendered conductive. Therefore, in the MOSFET, electrons are injected by the tunnel effect from the drain into the floating gate electrode thereof. As a result, the threshold value of the MOSFET is shifted in a positive direction. Thus, logic data "1" is stored into a desired address location.

When the intermediate voltage Vppm is applied to the bit line, injection of electrons will not occur in the selected floating gate type MOSFET. In this case, the threshold value of the MOSFET is kept unchanged. This state is defined as a logic "0" storing state.

The operation of erasing data in the NAND cell type EEPROM is simultaneously effected for each predetermined block, which is generally the entire portion of one chip of the EEPROM is dealt as one block. This is so-called "simultaneous erasing." At this time, all of the NAND cell units of the EEPROM are electrically separated from the bit lines, substrate and source voltage. The control gate electrodes of all of the memory cell transistors are set at 0 volt and the substrate voltage (and the well potential if the NAND cell units are formed in a well region) is set to the high voltage Vpp. As a result, in all of the memory cell transistors, electrons are moved from the floating gate electrodes thereof to the substrate (or the well region). The threshold values thereof are shifted in a negative direction. The stored data items are electrically erased at the same time.

In order to selectively read out the stored data of a specified memory cell transistor, 0 volt is applied to the control gate electrode of the selected memory cell transistor. All of the remaining memory cell transistors of the EEPROM are set to the power source voltage Vcc (5 volts) All of the select transistors are rendered conductive by application of the power source voltage Vcc to the gate electrodes thereof. The logic value of the stored data can be determined by checking whether or not current flows in a common source layered line which is also associated with the specified NAND cell unit including the selected memory cell transistor.

In the above data write-in mode, those of the non-selected memory cell transistors of each NAND cell unit which lie between the target memory cell transistor and the select transistor function as "transfer gates" for transferring a logic data voltage to the selected memory cell transistor. It may be considered that the non-selected memory cell transistors also function as transfer gates for transferring readout data in the data readout mode.

In order to keep the data transferring efficiency high, the threshold values thereof are required to be always set within a properly defined range. Further, the EEPROM comes with variation in the power source voltage itself, variation in quality caused in the manufacturing process and/or aging deterioration of the physical property of the EEPROM under various application environments (especially, temperature) for the end users. Taking such fact into consideration, it would be desirable to design a range narrower than the above range so as to add a safety margin. After the simultaneous erasing operation is repeatedly effected in the NAND cell type EEPROM, the threshold values of the memory cell transistors will vary. Actually manufactured NAND cell EEPROMs are required to sufficiently "absorb" such variations in the threshold values. Otherwise, the reliability of the EEPROMs obtained after the shipment from the semiconductor manufacturers cannot be expected to be high.

Conventionally, compensation for variation in the threshold values of memory cell transistors has been made at the LSI design level. For example, floating gate type MOSFETs are so designed that the threshold values thereof may be set within a range of 0.5 to 3.5 volts. In the manufacturing process, actually obtained EEPROMs are individually subjected to the threshold value test. Only those of the EEPROMs which have passed the test are shipped. As an example of such test, the electrical threshold value distribution measurement based on the readout current detection in the manufacturing line, and a threshold value variation test by an aging test under the atmosphere of high temperature are carried out; those of the products which have not passed the tests are rejected. In this way, the operation reliability of the NAND cell type EEPROMs has been enhanced.

However, only with the above measure, it cannot be expected to improve the operation reliability of NAND cell type EEPROMs while the manufacturing yield thereof is kept high. The main reason is as follows: no sorting test is actually effected for spatial or temporal variation in the threshold value caused by simultaneous erasing of data. This is because the control circuit is inevitably made complicated in construction if the above sorting test is effected. The threshold values of the memory cell transistors at the time of data erasing are of the negative polarity. In order to measure the value, it is naturally required to use a negative bias voltage. No negative power source is used in the control circuits contained in ordinary NAND cell type EEPROMs. If a power source of negative polarity is forcedly used in such a construction, an exclusive external connection terminal must be specially added to each package of the EEPROMs. The construction of the control circuit therefor is made complicated. In practice, the above modification made only for the reliability test cannot be satisfactorily accepted by the semiconductor manufacturers who are strictly required to reduce the cost of the products.

SUMMARY OF THE INVENTION

It is therefore an object of the present invention to provide a new and improved electrically erasable programmable semiconductor memory device which is excellent in the operation reliability.

In accordance with the above object, the present invention is drawn to an electrically erasable non-volatile semiconductor memory device which comprises a semiconductor substrate, parallel data transfer lines formed on the substrate, parallel control gate lines formed on the substrate to insulatively intersect the data transfer lines, and metal insulator semiconductor field effect transistors formed at intersections between the data transfer lines and the control gate lines. The transistors function as memory cell transistors. Each of the transistors has an electrically floating charge storage gate electrode and a control gate electrode. Each memory cell transistor is connected at the control gate electrode thereof to a corresponding one of the control gate lines. The memory cell transistors are divided into a plurality of cell units each of which has a series-connected circuit of a preset number of memory cell transistors. The series-connected circuit has a first end connected to a corresponding one of the data transfer lines and a second end connected to a common source potential line together with the other series-connected circuits. A biasing circuit is provided which is set operative when specified so as to raise the potential of the common source line by a previously selected bias potential, thereby permitting measurement of the distribution of the threshold values of the memory cell transistors in the erasing state while inhibiting use of a negative voltage.

The foregoing and other objects, features and advantages of the invention will become more apparent in the detail description of preferred embodiments presented below.

BRIEF DESCRIPTION OF THE DRAWINGS

In the detailed description of preferred embodiments of the present invention presented below, reference is made to the accompanying drawings in which.

DETAILED DESCRIPTION OF THE PREFERRED EMBODIMENTS

Figure 1:
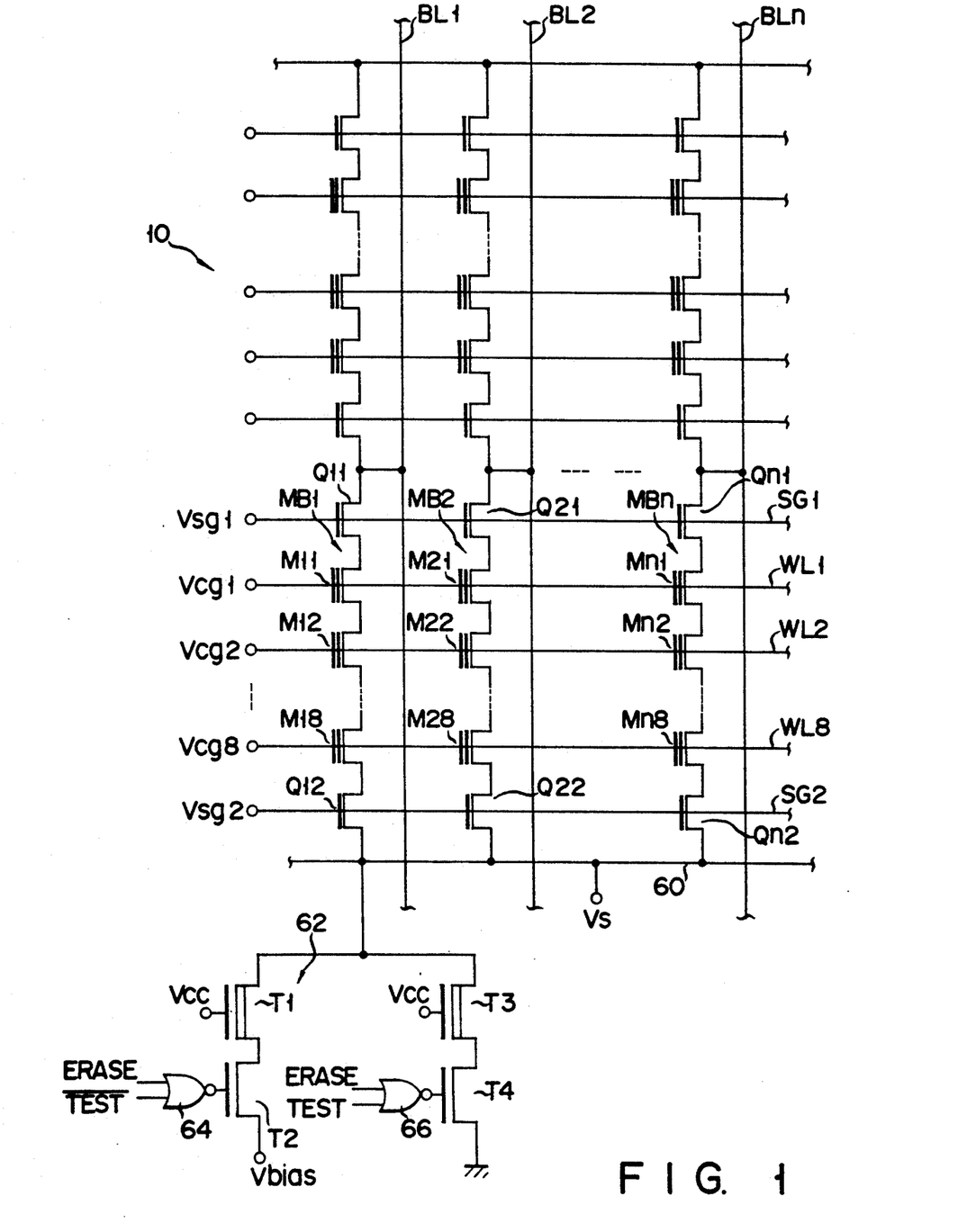
FIG. 1 is a diagram schematically showing the circuit construction of the main portion of a NAND cell type EEPROM according to a preferred embodiment of this invention.

Referring now to FIG. 1, a NAND cell type electrically erasable programmable read-only memory or EEPROM in accordance with to one preferred embodiment of this invention is generally designated by a reference numeral "10." The NAND cell type EEPROM 10 has parallel data transfer lines BL and parallel address control lines WL. The address control lines WL insulatively intersect the data transfer lines in a plane on a chip substrate 12 (see FIG. 2). The data transfer lines BL are called bit lines; the address control lines WL are called word lines.

Each bit line BLi (i=1, 2, . . . , n) is connected to series circuits MB of a previously selected number of floating gate type metal oxide semiconductor field effect transistors. In this embodiment, each transistor series circuit MBi consists of 8 floating gate type MOSFETs Mi1, Mi2, ..., Mi8. For example, the transistor series circuit MB1 has floating gate type MOSFETs M11, M12, ..., M18 as shown in FIG. 1. Each MOSFET Mij (i=1, 2, ..., n; j=1, 2, ..., 8) functions as a memory cell for storing unit logic data. The series array of 8 memory cells is hereinafter referred to as a "NAND cell unit" and the floating gate type MOSFETs M are fererred to as "memory cell transistors" or simply "memory cells." The construction of the upper half of the memory cell matrix in FIG. 1 is essentially the same as that described above.

In each NAND cell unit MBi, memory cell transistors Mi1, Mi2, ..., Mi8 are electrically connected at the control gate electrodes thereof to the word lines WL1, WL2, ..., WL8, respectively. Each of the NAND cell units MB1, MB2, ..., MBn is connected to a corresponding bit line BLi via a first single gate type metal oxide semiconductor field effect transistor or MOSFET Qi1. For example, the NAND cell unit MB1 is connected to the bit line BL1 via the MOSFET Q11. The MOSFETs Q11, Q21, ..., Qn1 are commonly connected at the control gate electrodes thereof to a control gate line SG1. Each MOSFET Qi1 is selectively rendered conductive in response to a voltage signal Vsg1 supplied to the control gate line SG1 and causes a NAND cell unit MBi associated therewith to be electrically connected to a corresponding bit line BLi. The switching MOSFET Qi1 is referred to as a "first select transistor."

As shown in FIG. 1, the NAND cell units MB1, MB2, ..., MBn are commonly connected to a common source potential Vs, which is the same as the ground potential and is 0 volt in this embodiment, via second single gate type MOSFETs Q12, Q22, ..., Qn2, respectively. For example, in the NAND cell unit MB1, the second MOSFET Q12 is connected between the source electrode of a final-stage memory cell transistor M18 included in the NAND cell unit and the common source potential Vs. The second MOSFETs Q12, Q22, ..., Qn2 are commonly connected at the control gates thereof to a second control gate line SG2. Each MOSFET Qi2 effects the switching operation in response to a voltage signal Vsg2 supplied to the control gate line SG2, and when it is turned on, it electrically connects the NAND cell unit MBi associated therewith to the common source potential Vs. The switching MOSFET Qi2 is hereinafter referred to as a "second select transistor."

Figure 2:
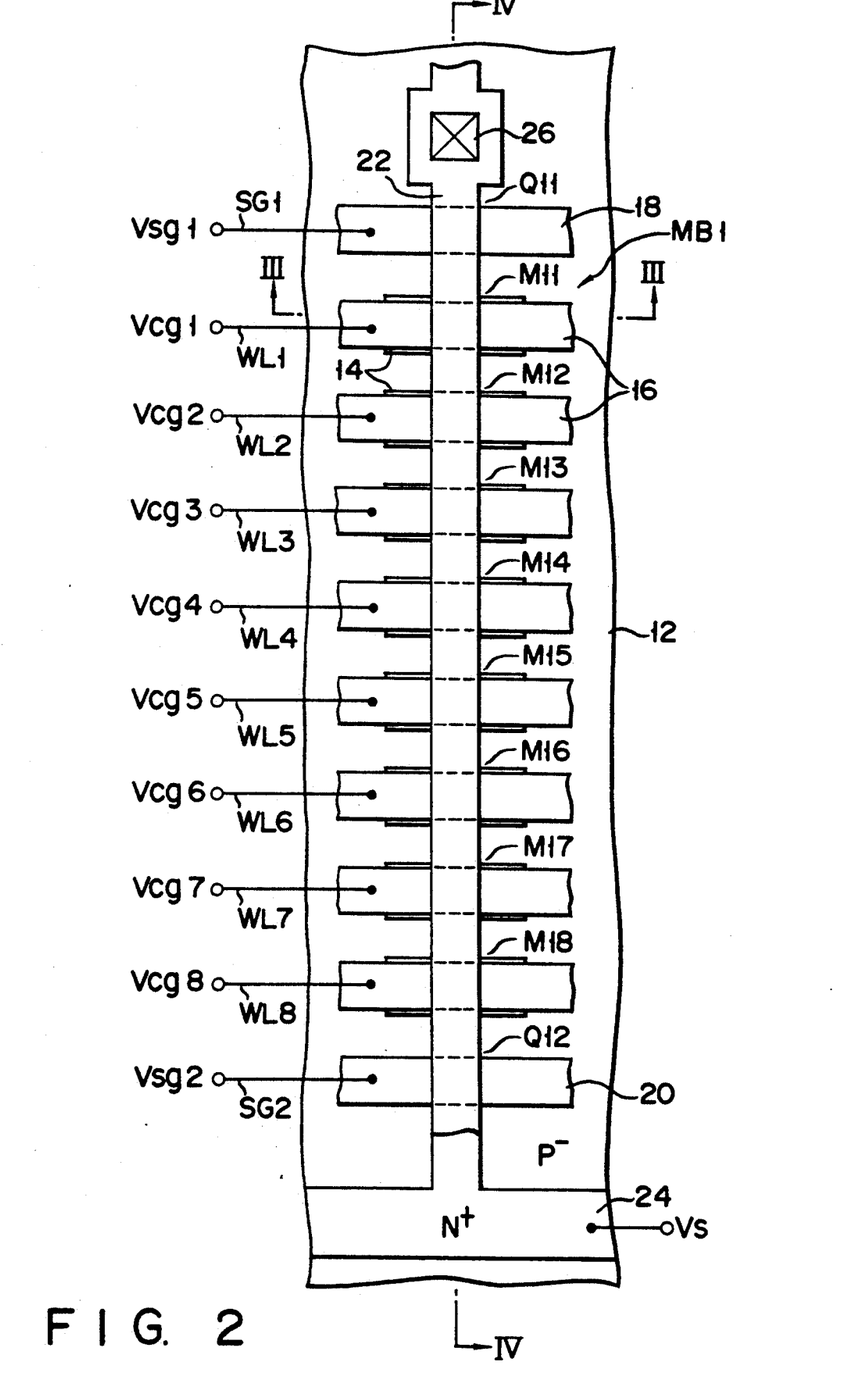
FIG. 2 is a diagram schematically showing the plane structure of a NAND cell unit in the EEPROM of FIG. 1.

The plane structure of 8 memory cell transistors M11 to M18 of the NAND cell unit MB1 is shown in FIG. 2. For easy understanding, insulation layers are omitted in FIG. 2. Each memory cell transistor M1i has a floating gate electrode 14 insulatively formed over a lightly doped P type (P− type) substrate 12 and a control gate electrode 16 insulatively formed over the floating gate electrode. In FIG. 2, the underlying floating gate electrode 14 is shown to be wider than the control gate electrode 16; but, this is merely a symbolic illustration. In practice, the width thereof is substantially the same as that of the control gate electrode. The first and second select transistors Q11 and Q12 are arranged on both end portions of the memory cell transistors M11 to M18. The select transistors Q11 and Q12 respectively include control gate electrodes 18 and 20 which are hereinafter referred to as "select gate electrodes."

The bit line BL1 may be a metal layer 22 which is formed with a small width to extend and insulatively intersect the control gate electrodes 16, the first gate electrode 18, and the second gate electrode 20. In FIG. 2, the bit line BL1 is illustrated to be partly cut away in the lower portion of the drawing for convenience so that a heavily-doped N type (N+ type) semiconductor diffusion layer formed in the surface area of the substrate 12 will be visible. The layer 24 holds the common source voltage Vs described before. The first select transistor Q11 is electrically connected at the drain to the bit line BL1 via a contact hole portion 26 formed in the metal wiring 22 which is the bit line BL1. The second select transistor Q12 is connected at the source thereof to the common source voltage Vs.

Figure 3:
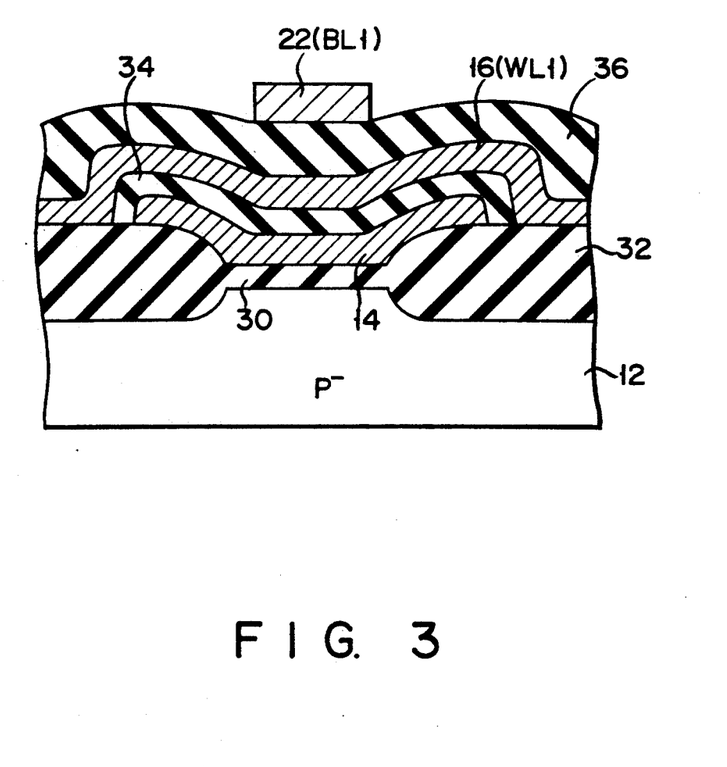
FIG. 3 is a diagram schematically showing the cross section of the plane structure of the NAND cell unit taken along the III—III break line of FIG. 2.

The cross-sectional structure of one of the memory cell transistors M included in the NAND cell unit MB1 shown in FIG. 3 in detail. A thin insulation film 30 is deposited in an element area defined by element isolation insulation layers 32 on the top surface of the P type substrate 12. The insulation layers may be chemical vapor deposition oxide films. The insulation film 30 functions as a gate insulation film. The floating gate electrode 14 serving as a charge storage portion is stacked on the gate insulation film 30. The length thereof is determined so that it may partly cover the element isolation insulation layer 32. The floating gate electrode 14 is covered with an insulation layer 34. The control gate electrode 16 having substantially the same width as the floating gate electrode 14 is formed on the insulation layer 34. As shown in FIG. 3, the electrode 16 is arranged to extend to the length corresponding to the word line WL1. The floating gate electrode 14 defines a preselected capacitance between it and the substrate 12; it also defines another capacitance between it and the control gate electrode 16. The control gate electrode 16 is covered with an insulation layer 36. The metal wiring layer 22 which is the bit line BL1 is arranged.

Figure 4:
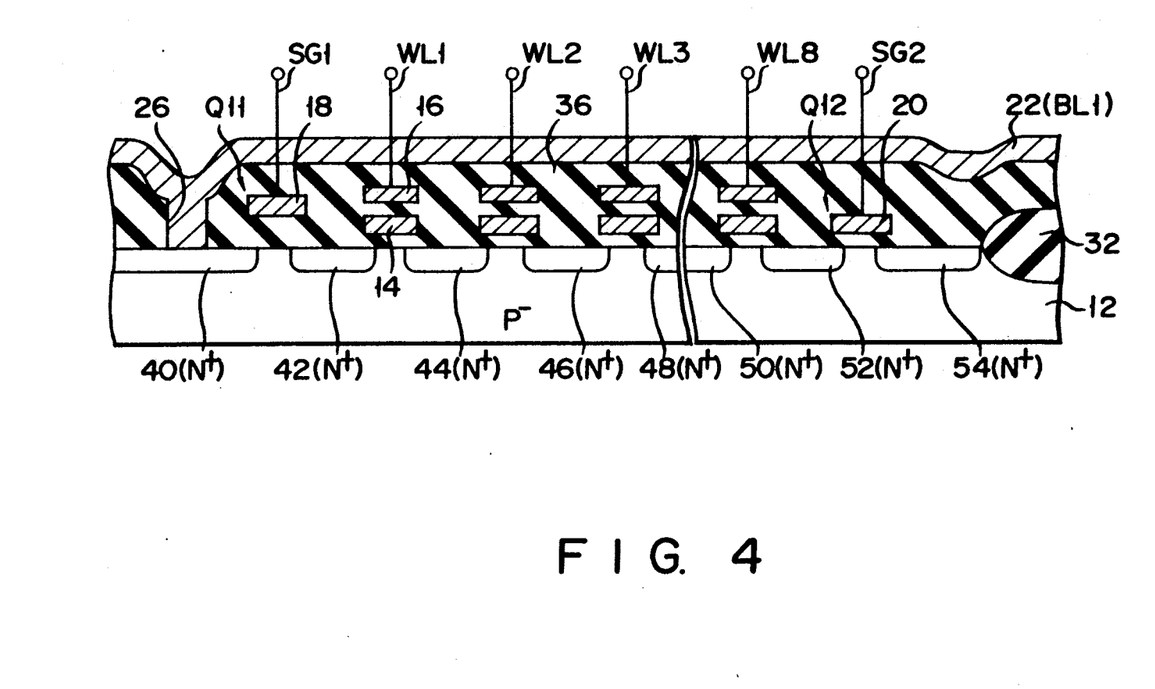
FIG. 4 is a diagram schematically showing the cross section of the plane structure of the NAND cell unit taken along the IV—IV break line of FIG. 2.

Turning now to FIG. 4, N+ type semiconductor diffused layers 40, 42, 44, 46, 48, ..., 50, 52 and 54 are arranged with a preset distance therebetween along the lengthwise direction of the bit line BL1 on the top surface portion of the P type substrate 12. The N+ type layer 40 serves as the drain of the first select transistor Q11. It will be easily understood by just viewing the drawing that the layer 40 is connected to the metal wiring layer 22 which is the bit line BL1 via the contact hole portion 26. The N+ type layer 42 serves as the source of the first select transistor Q11. At the same time, the N+ type layer 42 serves as the drain of the adjacent memory cell transistor M11. Likewise, the N+ type layer 44 serves as the source and drain of the adjacent memory cell transistors M11 and M12. The N+ type layer 54 serves as the source of the second select transistor Q12 and at the same time it is connected to the common source voltage Vs.

Turning back to FIG. 1, a common source line 60 for the NAND cell units MB1, MB2, ... MBn is connected with a threshold value measuring circuit 62. The circuit 62 applies, when desired, a bias voltage of proper potential level required in the erasing state of the EEPROM 10—i. e., the negative threshold value condition —to the common source line 60, in order to measure the distribution of variation in the threshold value of the NAND memory cell transistors M is the erasing state.

The threshold value measuring circuit 62 is basically formed of a two transistor series circuits: a series circuit of a depletion type (D-type) N-channel MOSFET T1 and an enhancement type (E-type) N-channel MOSFET T2 and a series circuit of a D-type N-channel MOSFET T3 and an E-type N-channel MOSFET T4. The power source voltage Vcc (=5 volts) of the EEPROM 10 is applied to the gate electrodes of the MOSFETs T1 and T3. The common source line 60 is connected to a positive bias voltage Vbias for testing via the MOSFETs T1 and T2. The common source line 60 is grounded via the MOSFETs T3 and T4.

A NOR gate circuit 64 is connected to the gate electrode of the E-type N-channel MOSFET T2. Another NOR gate circuit 66 is connected to the gate electrode of the E-type N-channel MOSFET T4. Two inputs of the NOR gate 66 are externally supplied with an erasing signal ERASE and a test starting signal TEST. At this time, the erasing signal ERASE and a test complementary signal $\overline{\text{TEST}}$ are externally supplied to the NOR gate 64. The signal $\overline{\text{TEST}}$ takes a rectangular waveform which is complementary with respect to a rectangular waveform of the test signal TEST.

Figure 5:
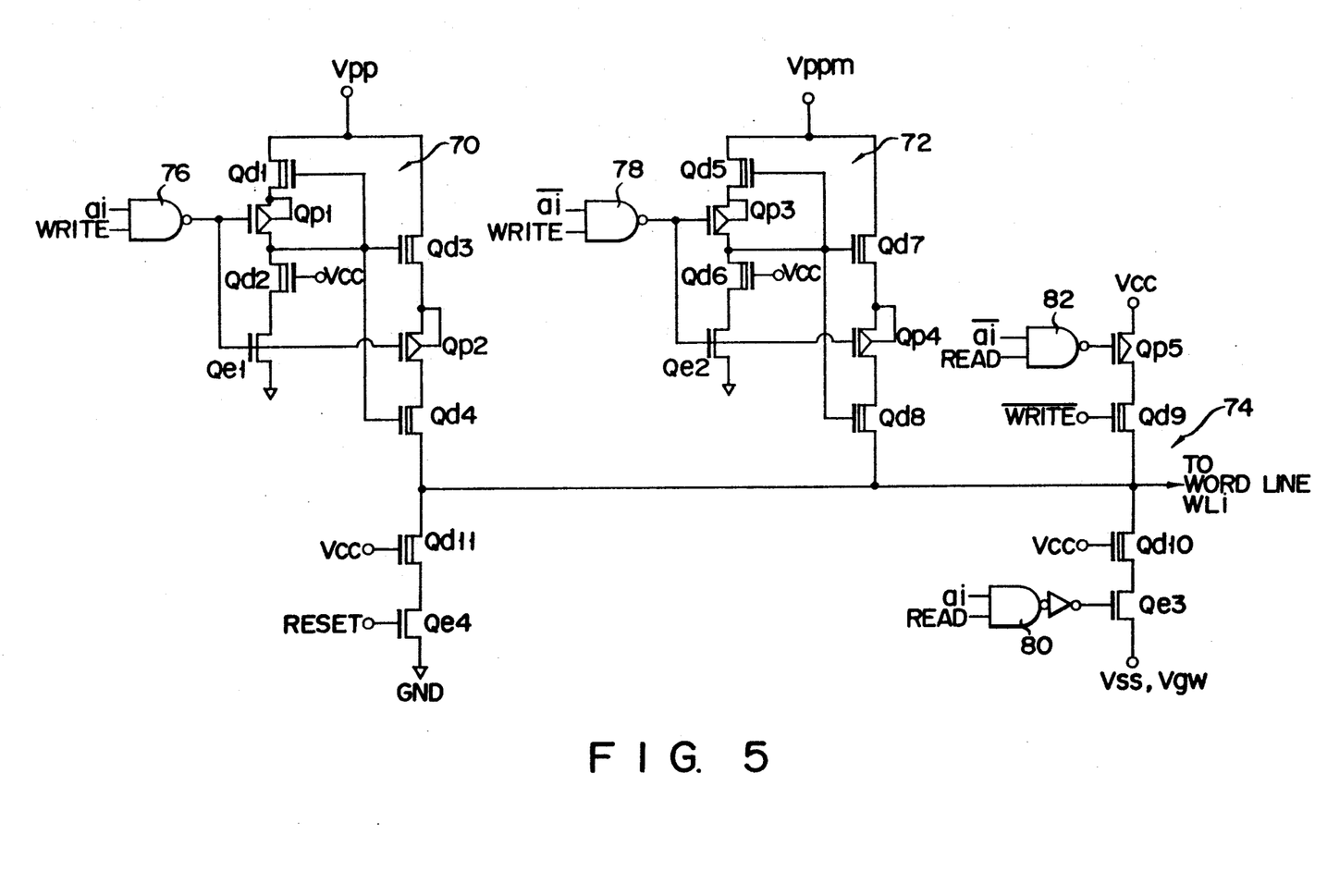
FIG. 5 is a diagram showing the construction of a gate control circuit which cooperates with NAND cell units of FIG. 1.

As shown in FIG. 5, the concrete construction of a control gate voltage controlling circuit section associated with each of the word lines Wi basically includes three circuit components 70, 72 and 74. A high potential supplying circuit 70 is provided for setting a selected gate to a high potential Vpp in the write-in operation. An intermediate potential supplying circuit 72 is for setting a non-selected control gate to an intermediate potential Vppm in the write-in operation. The third one is a readout control circuit 74.

The high potential supplying circuit 70 is mainly constituted by a NAND gate 76 for deriving a logic value of a write-in signal WRITE and an address signal ai, an E-type N-channel switching MOS transistor Qe1 controlled by the NAND gate 76, an E-type P-channel switching MOS transistor Qp1, and an E-type P-channel MOS transistor Qp2 serving as a output buffer. N-channel MOS transistors Qd1 and Qd2 for protecting the above switching MOS transistors from the high potential are respectively connected between the MOS transistors Qe1 and Qp1 and between the MOS transistor Qp1 and the high potential Vpp terminal.

The MOS transistors Qd1 and Qd2 are D-type MOS transistors whose threshold voltages range approximately between −3 volts and −4 volts. Also, D-type N-channel MOS transistors Qd3 and Qd4 are disposed on the source and drain sides of the buffer stage MOS transistor Qp2. The reason why the P-channel MOS transistor and D-type N-channel MOS transistor are used in the output stage as described above is that the control gate line can be set to the high potential Vpp without causing a voltage drop corresponding to the threshold value.

Particularly, when a high potential is supplied from the other circuit 72 or 74 to the control gate line or the word line WLi, the MOS transistor Qd4 positively prevents the high potential from being unwantedly supplied to the P-channel MOS transistor Qp2.

Like the high potential supplying circuit 70, the intermediate potential supplying circuit 72 includes a NAND circuit 78, an E-type N-channel switching MOS transistor Qe2 which is controlled by the NAND circuit 78, an E-type P-channel switching MOS transistor Qp3, an E-type P-channel MOS transistor Qp4 serving as an output buffer, and D-type N-channel MOS transistors Qd5 to Qd8.

The readout control circuit 74 includes NAND gates 80 and 82 for deriving logic of the readout signal READ and addresses ai and $\overline{\text{ai}}$, an E-type N-channel switching MOS transistor Qe3 controlled by an inverted signal of an output of the NAND gate 80, an E-type P-channel MOS transistor Qp5 for effecting the switching operation in response to an output of the NAND gate 82, D-type N-channel protection MOS transistors Qd9 and Qd10 connected between the control gate line and the respective switching MOS transistors. The source of the MOS transistor Qe3 is applied with a potential which is set to a different level in a different condition; it is applied with a source voltage Vss when the threshold voltage of a negative value is measured, and a positive voltage Vgw when the threshold voltage of a positive value is measured. The source is applied with the voltage Vss in a read mode of the EEPROM 10.

The NAND cell type EEPROM 10 disclosed here is the same as the same types of conventional EEPROMs in the basic operations of selective writing of logic data, reading of the same and simultaneous erasing of logic data. That is, it is operated in a manner which has been explained in the introductory part of this specification although knowing that insertion of the explanation inevitably makes long the introductory part. The more detail information can be obtained by referring to the content from column 5, line 61 through column 9, line 19 of U.S. Pat. No. 4,939,690 to Momodomi et al. which was issued on Jul. 3, 1990, for example.

Contribution of the control circuit of FIG. 5 to the basic operations of data accessing is now explained hereinafter. The EEPROM 10 is first subjected to the simultaneous erasing prior to the data writing. At this time, in the control circuit of FIG. 5, the MOSFET Qe4 of the high potential supplying circuit 70 is rendered conductive in response to the reset signal RESET. A corresponding word line WLi is connected to the ground potential. This operation is effected for all of the word lines WL at the same time. Therefore, gate control voltages Vcg1, Vcg2, . . . , Vcg8 of 0 volt are applied to all of the word lines WL associated with the NAND cell units MB shown in FIG. 1.

Since, in this period of time, the select gate lines SG1 and SG2 are also set to 0 volt, the first and second select transistors Q1 and Q2 are rendered nonconductive. All of the NAND cell units MB are electrically isolated from the bit lines and substrate 12. The high voltage Vpp such as a 20-volt biasing voltage is applied to the substrate 12 and is kept applied for a predetermined period of time, for example, 10 milliseconds. As a result, electrons are emitted from the floating gate electrodes 14 in all of the memory cell transistors M of all of the NAND cell units MB. The threshold voltages thereof are shifted in a negative direction. The state is defined as the logic "0" data storing state and corresponds to the data erasing state.

When the EEPROM 10 is set in the data write-in mode, the write-in signal WRITE is supplied to a control circuit associated with every memory cell transistor M of the NAND cell units MB. At this time, address signals ai and $\overline{\text{ai}}$ are supplied to the NAND gate 76 of the high potential supplying circuit 70 and the NAND gate 78 of the intermediate potential supplying circuit 72 of the above control circuit according to an address of a memory cell transistor Mi into which data is to be written.

Assume now that the target memory cell transistor into which data is to be written is the transistor M3 of the NAND cell unit MB. Then, the first select transistor Q11 of the NAND cell unit MB1 is rendered conductive in response to application of a turn-on controlling voltage corresponding to sum of the intermediate voltage Vppm and its threshold voltage Vth (approximately, 12 or 13 volts). In the control circuit associated with the selected memory cell transistor M3 and having the construction shown in FIG. 5, logical operations for the write-in signal WRITE and the address signals ai and $\overline{ai}$ are effected by the NAND gates 76 and 78; as a result, the high potential supplying circuit 70 is activated, and therefore the high potential Vpp is applied to the control gate of the selected memory cell transistor M3 via a corresponding word line WL3. In the control circuits operating in cooperation with the transistors M1 and M2 which are included in the remaining non-selected memory cell transistors M1, M2, and M4 to M8 of the NAND cell unit MB1 and which lie between the target memory cell transistor M3 and the first select transistor Q11, the intermediate potential supplying circuits 70 are activated. The intermediate potential Vpp (for example, 10 volts) is applied to the control gates of the memory cell transistors M11 and M12 via corresponding word lines WL1 and WL2. Therefore, the memory cell transistors M11 and M12 are rendered conductive, thereby permitting write-in logic data—which is set at 0 volt for data "1" and at the intermediate potential Vppm for data "0"—supplied via the bit line BL1 to be transferred to the target memory cell M13.

When the EEPROM 10 is set in the data readout mode, the readout signal READ and address signals ai and $\overline{ai}$ are supplied to the NAND gates 80 and 82 (see FIG. 5) of each of the control circuits which operate in cooperation with the memory cell transistors Mi1 to Mi8, while the first and second select gate lines SG1 and SG2 being applied with the power supply voltage Vcc. The readout control circuit 70 of the control circuit connected to a selected memory cell transistor Mi according to the designated address ai is activated, thereby causing 0 volt to appear on a corresponding word line WLi. The power source voltage Vcc is supplied to the remaining word lines WL1, WL2, ..., WL(i−1), WL(i+1), ..., and WL8, and bit lines BL. The potential on the common source line 60 is maintained at the ground potential Vs. In this state, the logic value of the readout data is detected by using a sense amplifier (not shown) which is known in the art to check whether or not current (readout current) flows from the bit line BLi into the common source line 60.

The measurement of distribution of the threshold values of memory cell transistors M subjected to the simultaneous erasing of data at the product shipping stage in the process of manufacturing the NAND cell type EEPROM 10 for effecting the above-described basic operations can be easily effected with the assistance of the threshold value measuring circuit 62 of this invention as follows.

When test starting signals TEST and $\overline{TEST}$ are externally supplied to the test circuit 62, the EEPROM 10 is set into the test mode. The test mode is basically equivalent to the ordinary data readout mode except that any negative voltage is not used at all. Therefore, 0 volt is applied to a selected control gate line, that is, word line WLi; and the power source voltage Vcc is supplied to the remaining word lines WL1, ..., WL(i−1), ..., WL8, and the first and second control gate lines SG1 and SG2. It should be noted that the bit lines BL1 to BL8 receive a specified potential which is higher than their initial potential by a previously selected bias potential which is given to the common source line 60 as will be described below.

In the test circuit 62, the test starting signal TEST is set at an "H" level and therefore the signal $\overline{TEST}$ is set at an "L" level. The erasing signal ERASE has an "L" level. An output potential of the NOR gate 64 is set to the "H" level in response to the signals TEST, $\overline{TEST}$ and ERASE. Therefore, the MOSFET T2 is rendered conductive. A previously selected positive bias potential is transmitted to the common source line 60 via the MOSFETs T1 and T2. Since, in this period of time, the MOSFET T4 is kept conductive, the ground potential is inhibited from being applied to the common source line 60. The application of a positive bias voltage Vbias to the common source line 60 creates a "pseudo erasing state" equivalent to the state in which the selected word line WLi is biased to a negative potential while the common source line 60 is grounded. Therefore, the distribution of the actual threshold values of the memory cell transistors M in the erasing mode of the EEPROM 10 can be measured without using any negative voltage by detecting a readout current appearing on the common source line 60 while the bias voltage Vbias is being changed.

In the above embodiment, when the P type substrate 12 (or a P type well region formed in the surface area of the substrate when the substrate 12 is of N type) is fixed at the ground potential, that is, at 0 volt in the test mode, the bias effect occurs in the substrate 12 by applying a positive bias voltage Vbias to the common source line 60 as described above, and as a result, the measured threshold values will contain errors corresponding to the bias effect. In this case, in order to measure the precise distribution of the threshold values, it is necessary to eliminate deviation components caused by the bias effect. An embodiment for effectively attaining this is presented below.

Figure 6:
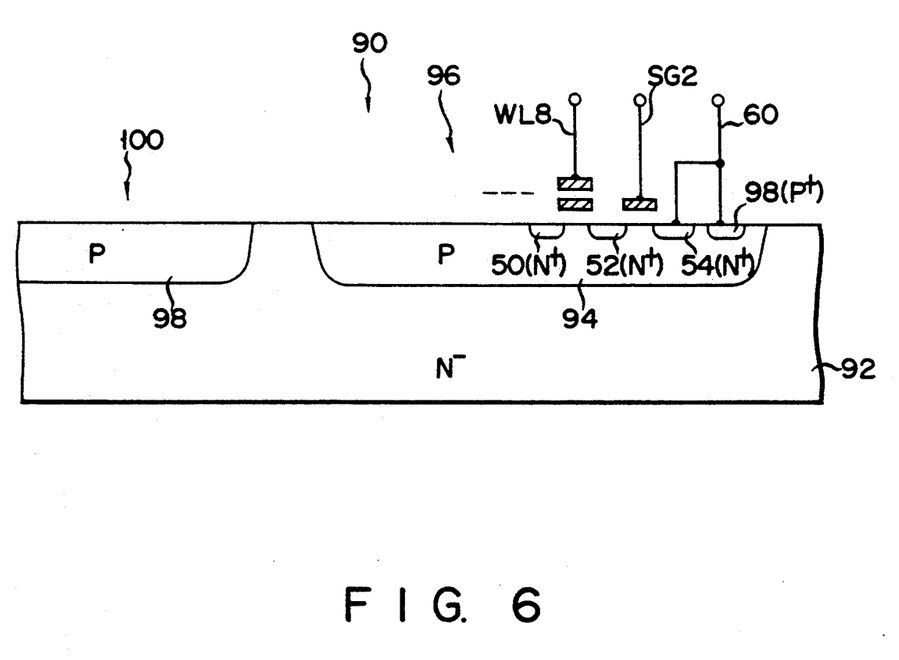
FIG. 6 is a diagram schematically showing the end face structure of the main portion of a NAND cell type EEPROM according to another embodiment of this invention.

As shown in FIG. 6, a substrate 92 of the EEPROM 90 is formed of N⁻ type silicon. A P type well region 94 is formed in a formation region for NAND cell units MB of the substrate 92, that is, in the surface area of a memory cell array region 96. Assume that first and second select transistors Q and memory cell transistors M of the NAND cell units MB described before are formed in the well region 94. The common source line 60 is electrically connected to the well region 94 via a P+ type diffused layer 98. Another P type well region 98 is formed in a peripheral substrate portion 100 of the memory cell array 96. The P type well region 98 is isolated from the P type well region 94 as shown in FIG. 6. A test circuit 102 of this invention is formed in the well region 98.

Figure 7:
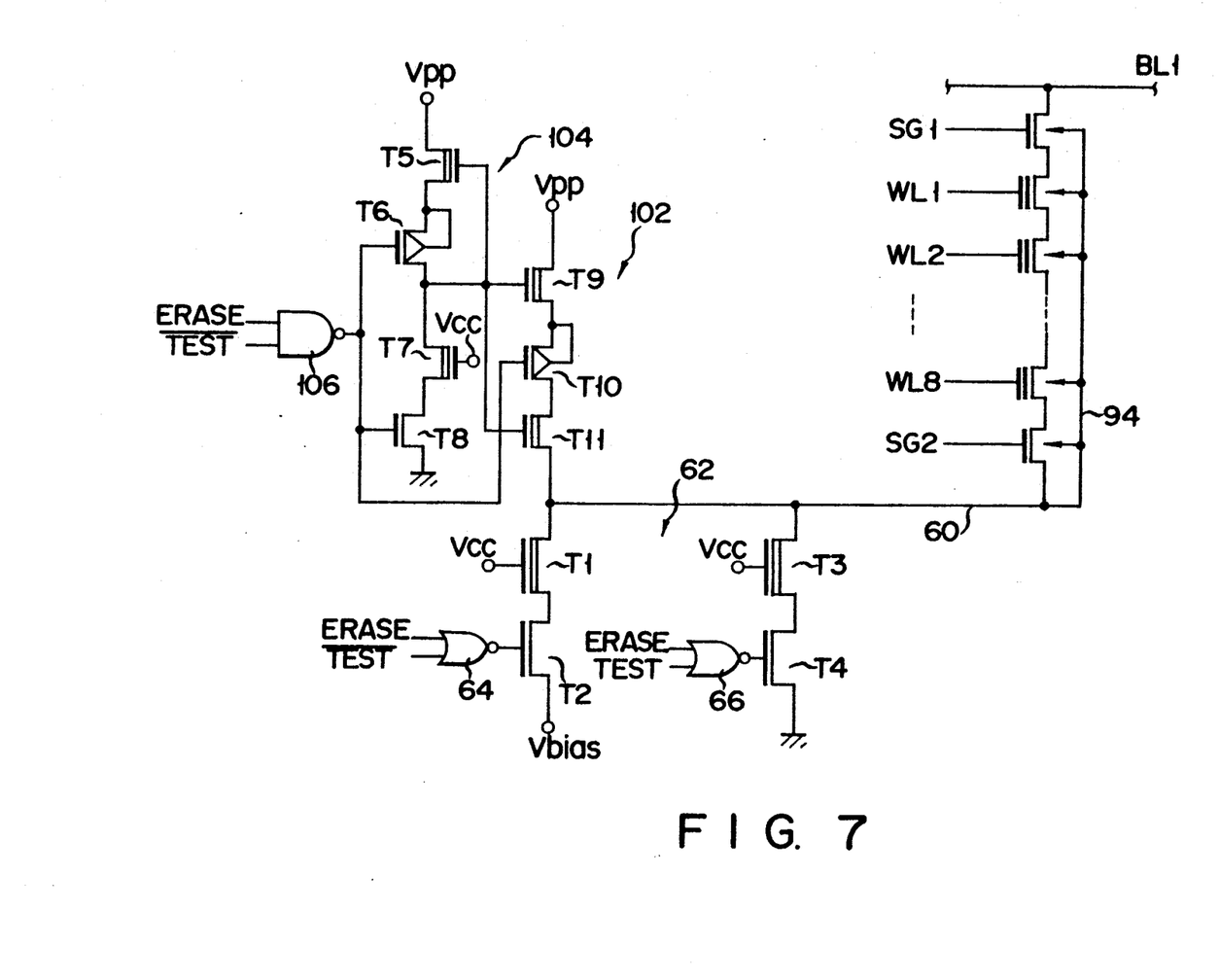
FIG. 7 is a diagram showing the construction of a threshold value measuring circuit which can be preferably applied to the embodiment of FIG. 6.

The test circuit 102 is featured in that a well potential control circuit 104 is provided in addition to the circuit structure shown in FIG. 1. The additional circuit 104 is constituted by connecting a NAND gate 106 receiving an erasing signal ERASE and a test signal $\overline{TEST}$; a series circuit of MOSFETs T5 to T8 connected between the high potential Vpp and the ground potential; and a series circuit of MOSFETs T9 to T11 as shown in FIG. 7. The circuit 104 selectively applies the high potential Vpp to the P type well region 94 in response to the erasing signal ERASE. Naturally, in this case, the voltage Vpp is also applied to the common source line 60 via the P+ type layer 98.

With such an arrangement, the test circuit 102 becomes operative in the test mode of the EEPROM 90 to supply a positive bias voltage Vbias to the common source line 60; and at the same time, applies the voltage Vbias to the well region 94 containing all of the memory cell transistors M of the NAND cell units MB independently from the other well region 98. During this period, the well region 98 of the peripheral circuit section 100 is kept unchanged and maintains the same potential state. Therefore, the test circuit 102 receives no influence by application of the bias voltage Vbias. As a result, in the pseudo erasing mode of the EEPROM 90, it is possible to measure a correct distribution of the threshold values substantially completely free from deviation components caused by the bias effect.

The present invention is not limited to the above-described specific embodiments and may be practiced or embodied in still other ways without departing from the spirit or essential character thereof. For example, the threshold measuring technique using the test circuits 62 and 102 of this invention can be applied not only to the NAND cell type EEPROM but also to NOR cell type EEPROMs.

What is claimed is:

1. An electrically erasable nonvolatile semiconductor memory device comprising:
  a semiconductive substrate;
  parallel data transfer lines arranged on said substrate;
  parallel control gate lines transverse to said data transfer lines to define intersections therebetween on said substrate;
  metal insulator semiconductor field effect transistors with threshold voltages which are arranged at said intersections as memory cell transistors, each of said transistors having a control gate and a charge storage portion, and being connected at its control gate electrode to a corresponding one of said control gate lines,
  said memory cell transistors defining a plurality of cell units each of which has a predetermined number of series-connected memory cell transistors having a first end connected to a corresponding one of said data transfer lines and a second end connected to a common source line together with the others of said series-connected memory cell transistors; and
  bias means for raising a presently applied voltage on said common source line by a previously selected bias potential, and for permitting a measurement of distribution of the threshold voltages of said memory cell transistors in the erasing state while inhibiting use of a negative voltage.

2. The device according to claim 1, wherein said bias means applies substantially zero volt to a selected one of said control gate lines, and applies the remaining control gate line or lines with a readout voltage to be used in a data readout mode of said device, whereby a voltage of the control gate electrodes of those memory cell transistors connected together to the selected control gate line is lower than the voltage on said common source line.

3. The device according to claim 2, wherein said bias means has a switching transistor which is connected to said common source line, externally receives a positive voltage, and is rendered conductive to apply the positive voltage to said common source line.

4. The device according to claim 3, wherein said substrate has in its surface area a first semiconductor well region which is different from said substrate in its conductivity type, said memory cell transistors being arranged in the first well region.

5. The device according to claim 4, wherein said substrate has in another surface area thereof a second semiconductor well region which is different from said substrate in its conductivity type and electrically isolated from said first well region, said bias means being arranged in said second well region.

6. The device according to claim 5, wherein said common source line is electrically connected to said first well region.

7. An electrically erasable programmable read-only memory comprising:
  a semiconductive substrate;
  bit lines insulatively arranged on said semiconductor substrate;
  word lines arranged to insulatively intersect said bit lines on said semiconductor substrate;
  memory cell sections each of which has as memory cell transistors a preselected number of arrayed floating gate type field effect transistors connected to said bit lines and said word lines;
  a first switching transistor provided at a first end of each memory cell section to selectively connect it to a corresponding bit line;
  a second switching transistor provided at a second end of each memory cell section to selectively connect it to a source potential line; and
  voltage adjusting means associated with said word lines and said source potential line, for selectively applying a positive DC voltage having a predetermined potential level to said source potential line in response to an externally supplied electrical signal, and for maintaining a voltage potential on a word line associated with a memory cell transistor which is selected from said memory cell transistors at a level lower than said positive DC voltage.

8. The memory according to claim 7, wherein said voltage adjusting means comprises:
  a logic gate circuit for externally receiving said electrical signal; and
  a transistor circuit connected to said logic gate circuit, for externally receiving said positive DC voltage and selectively varying the voltage potential on said source line between said positive DC voltage and a ground potential.

9. The memory according to claim 8, wherein said transistor circuit includes a metal insulator semiconductor field effect transistor.

10. A method of measuring threshold voltages of memory cell transistors, suitable for an electrically erasable programmable read-only memory which comprises bit lines insulatively arranged on a semiconductive substrate, word lines provided to insulatively intersect said bit lines on said substrate, and memory cell sections each of which has as memory cell transistors a preselected number of arrayed floating gate type field effect transistors connected to said bit lines and said word lines, said method comprising the steps of:
  temporarily setting a voltage potential on a common source potential line to which said memory cell sections are connected to a positive DC voltage of a predetermined potential level; and substantially simultaneously,
  maintaining a voltage potential on a word line associated with a memory cell transistor selected from said memory cell transistors at a level lower than said positive DC voltage.

11. The method according to claim 10, further comprising the step of:
maintaining potentials on word lines associated with the remaining memory cell transistors at a specific potential to be used in a data readout mode of said memory.

12. The method according to claim 11, further comprising the step of:
electrically isolating a surface area of said substrate in which said memory section is arranged from another surface area of said substrate while said positive DC voltage is being applied to said common source line.

* * * * *